United States Patent [19]

Cheng

[11] Patent Number: 4,843,439

[45] Date of Patent: Jun. 27, 1989

[54] TAILORABLE INFRARED SENSING DEVICE WITH STRAIN LAYER SUPERLATTICE STRUCTURE

[75] Inventor: Li-Jen Cheng, LaCrescenta, Calif.

[73] Assignee: The United States of America as represented by the Administrator of the National Aeronautics and Space Administration, Washington, D.C.

[21] Appl. No.: 125,676

[22] Filed: Nov. 25, 1987

Related U.S. Application Data

[62] Division of Ser. No. 901,114, Aug. 28, 1985, abandoned.

[51] Int. Cl.$^4$ ............................................. H01L 27/12
[52] U.S. Cl. .......................................... 357/4; 357/30; 357/13; 357/61
[58] Field of Search .................. 357/4 SL, 13, 40, 46, 357/16, 61, 30 E, 30 N

[56] References Cited

U.S. PATENT DOCUMENTS

| | | | |
|---|---|---|---|
| 3,626,257 | 12/1971 | Esaki | 357/4 SL |
| 4,147,667 | 4/1979 | Chevalier | 252/501 |
| 4,348,686 | 9/1982 | Esaki | 357/30 |
| 4,450,463 | 5/1984 | Chin | 357/30 |
| 4,491,682 | 1/1985 | Hamakawa | 357/30 |
| 4,513,305 | 4/1985 | Blors et al. | 357/30 |
| 4,514,748 | 4/1985 | Bean | 357/30 |
| 4,529,455 | 7/1985 | Bean | 29/576 E |
| 4,558,336 | 12/1985 | Chang | 357/4 |
| 4,561,005 | 12/1985 | Shannon | 357/24 |
| 4,616,241 | 10/1985 | Biefeld | 357/16 |
| 4,725,870 | 2/1988 | Bean | 357/4 SL |

FOREIGN PATENT DOCUMENTS 55-93275 7/1980 Japan.
58-215083 12/1983 Japan.

OTHER PUBLICATIONS

Manasevit et al., *Journ. of Electronic Materials*, vol. 12, No. 4, 1983, pp. 637–651.
Brugger et al, *Phys. Rev. B*, vol. 33, No. 8, Apr. 1986, pp. 5928–5930.
Hamakawa (editor), Amorphous Semiconductor Technologies & Devices, (1984), pp. 300–310, Article by Shimizu.
Hull et al., *Appl. Phys. Lett.*, 48(1), Jan. 6, 1986, pp. 56–58.
Pearsall et al, *IEEE Electron Device Lett.*, vol. ED-7, No. 5, May 1986, pp. 331–332.
*EDM Tech. Digest* 1985, pp. 759–760, Temkin et al.
People et al., *App. Phys. Lett.*, 45(11), Dec. 1, 1984, pp. 1231–1233.

*Primary Examiner*—Andrew J. James
*Attorney, Agent, or Firm*—Paul F. McCaul; Thomas H. Jones; John R. Manning

[57] ABSTRACT

An infrared photodetector is formed of a heavily doped p-type $Ge_xSi_{1-x}$/Si superlattice in which x is pre-established during manufacture in the range 0 to 100 percent. A custom tailored photodetector that can differentiate among close wavelengths in the range of 2.7 to 50 microns is fabricated by appropriate selection of the alloy constituency value, x, to establish a specific wavelength at which photodetection cut-off will occur.

15 Claims, 4 Drawing Sheets

TAILORABLE INFRARED SENSING DEVICE WITH STRAIN LAYER SUPERLATTICE STRUCTURE

This is a division of application Ser. No. 901,144, filed 8-28-86.

BACKGROUND OF THE INVENTION

1. Origin of the Invention

The invention described herein was made in the performance of work under a NASA contract and is subject to the provisions of Public Law 96-517 (35 USC 202) in which the Contractor has elected not to retain title.

2. Field of Invention

The present invention relates to a method for tuning infrared sensing devices and more particularly to a superlattice sensing device that is tuned during fabrication to discriminate among photons of arbitrary wavelengths in a pre-established tuning range.

DESCRIPTION OF THE PRIOR ART

FIG. 1 shows an energy diagram of a known structure for discriminating among photons of particular wavelengths. A first semiconducting layer $L_1$, having a conduction energy band beginning at a first conduction energy level $E_{C1}$, is formed adjacent a second semiconducting layer $L_2$, whose conduction band starts at a higher level $E_{C2}$. The difference in energy levels creates an energy well at the junction between layers $L_1$ and $L_2$. Charge carriers (electrons $e^-$) are trapped at the bottom of the energy well. The trapped carriers cannot move from one layer to the next until they absorb enough energy to raise them to a conduction level above the wall of the energy well. Well height $E_W$ is determined by $E_{C2} - E_{C1}$. Trapped carriers can be excited out of the well into conduction by photon radiation passing through the interlayer junction region. The incoming photons need to have a quantum energy that is larger than the wall height, $E_{photon} > E_W$, in order to excite the trapped carriers to a conduction level above $E_{C2}$ if carrier conduction is to occur.

The quantum energy of a photon is proportional to its frequency $v$:

$$E_{photon} = hv$$

where h is Planck's constant. The wavelength of a photon is inversely proportional to its energy:

$$\lambda = hc/E_{photon}$$

where c is the speed of light.

Wavelength discrimination occurs in heterojunction structures such as the one shown in FIG. 1 by virtue of the fact that only photons with wavelengths shorter than $hc/E_W$ can provide sufficient quantum energy to excite trapped carriers out of the energy well into conduction. When these higher frequency photons are absorbed by the trapped carriers, the carriers attain enough energy to move into the conduction band of the adjacent layer. Absorption is detected by sensing charge carrier conduction (electric current). Photon radiation having wavelengths longer than $\lambda_{max} = hc/E_W$ will not be detected.

The point of discrimination or the critical photon wavelength above which detection will not take place is determined by $E_W$, the well height. Ideally, $E_W$ should be adjustable to any arbitrary value thus permitting discrimination at wavelengths of particular interest. No simple technique exists in the prior art however for adjusting $E_W$ to suit the needs of a specific photo-detection application. There is also no simple method previously known for connecting such a custom-tuned photodetector directly to an electronic signal processing circuit for which the photodetector is intended at the time of fabrication.

Recent advances in molecular beam epitaxy techniques have simplified the fabrication of multilayer structures known as superlattices. Superlattice structures are formed by selective deposition of thin layers of different semiconductor materials one above the other in a stacked arrangement to create a plurality of heterojunctions in the vertical or stacking direction. Crystalline strain between nonhomogeneous semiconductor layers can be absorbed by a stretching mechanism at the layer interface. The stretching mechanism occurs naturally if the layers are made very thin. Such structures are called strain layer superlattices. Electrical conduction will take place through the superlattice structure when trapped carriers absorb sufficient energy to escape the energy wells created at the interlayer junctions. If a transparent radiation window is provided for admitting photons into the junctions, a photosensitive superlattice structure can be fabricated for detecting photons having energy levels or frequencies above that of the energy band difference at the superlattice layer junctions. The energy band difference of the superlattice depends on the semiconductor materials selected to form each of its plural heterojunctions. Wavelength sensitivity can be established by selecting the semiconductor materials of each layer according to known energy band characteristics to create a desired energy level difference at the interlayer junctions.

A photodetector having a superlattice structure is disclosed by Chin, U.S. Pat. No. 4,450,463. The Chin photodetector has alternating layers of group III-IV compounds such as GaAs and AlGaAs with matched lattice spacing (non-strain) joined to form heterojunctions that are responsive to wavelengths greater than 2 microns. Chin suggests that frequency sensitivity can be tuned by selecting materials other than the AlGaAs and GaAs compounds disclosed. The selected semiconductor materials must differ in their conduction band energy $E_C$ by an amount less than the energy of the longest photon wavelength to be detected. The suggested tuning process is considered coarse because it relies on discrete selection of two semiconductor compounds that are singularly selected from the collection of known materials to form the desired heterojunctions. Devices fabricated along the line suggested by Chin are not easily fine tuned to discriminate among photons of arbitrary wavelength. The critical wavelength at which discrimination might be desired can be any arbitrary value. In most instances the desired value will not correspond exactly with the conduction band difference of available semiconductor compounds at the time of manufacture. A manufacturing technique that allows precise matching of the heterojunction energy band difference to the desired critical wavelength would improve the usefulness of such devices.

When a photodetector is manufactured, it is economically desirable to fabricate the photodetector on a substrate which includes VLSI processing circuitry for processing signals developed by the photodetector. VLSI circuits are currently being fabricated on silicon substrates. A tunable superlattice detector that is compatible with such substrates would find broad application in robotics, space exploration, etc. The GaAs device disclosed by Chin is neither compatible with the silicon fabrication technology currently used for manufacturing VLSI circuits nor finely tunable at the time of manufacture to permit discrimination among photons of arbitrary wavelength.

SUMMARY OF THE INVENTION

It is one object of the present invention to provide a superlattice photodetector suited for fabrication on a silicon substrate. It is a second object of the present invention to provide a superlattice detector whose wavelength sensitivity is tunable during manufacture to any arbitrary wavelength in a pre-established wavelength range.

The above objectives are realized by fabricating a $Ge_xSi_{1-x}/Si$ superlattice structure on a silicon substrate in which alternating superlattice layers include semiconductor layers whose valence band energy difference is tailored by adjusting the relative alloy constituency number, x, of the $Ge_xSi_{1-x}$ layers between 0 and 100 percent during manufacture.

In broader respects, the invention is summarized as a manufacturing method in which a semiconductor superlattice is formed of two different material layers, at least one of the layers being an alloy of the general form $(A_xB_{1-x})_y C_{1-y}$ whose energy band characteristics are tailored by adjusting x during fabrication where A and B are alloy constituents whose relative concentrations affect the energy band characteristics of the resultant alloy.

DETAILED DESCRIPTION OF THE PREFERRED EMBODIMENT

Fine tuning at the time of manufacture is realized according to the present invention by using an alloy having energy characteristics that are a function of its alloy component ratio, as one layer of a superlattice structure and adjusting that ratio at the time of fabrication.

Figure 1:
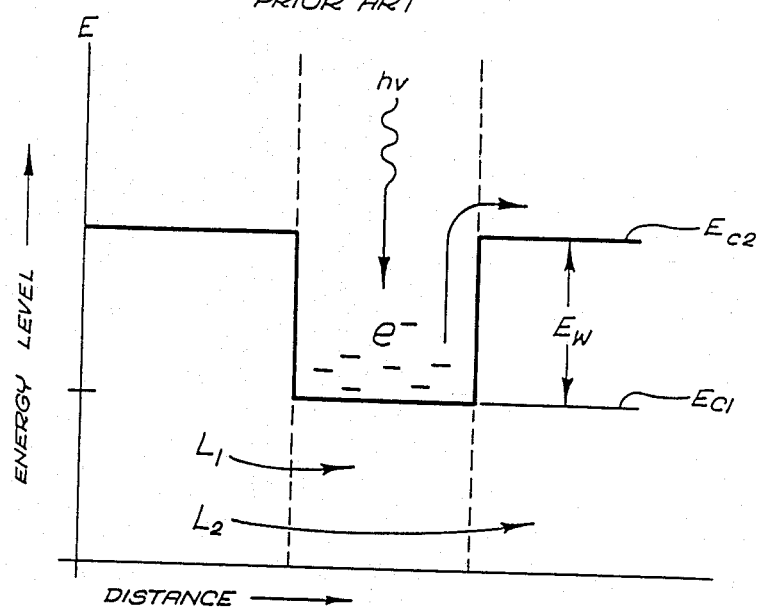
FIG. 1 is an energy diagram illustrating photon excitation of charge carriers in a known energy well structure.
Figure 2:
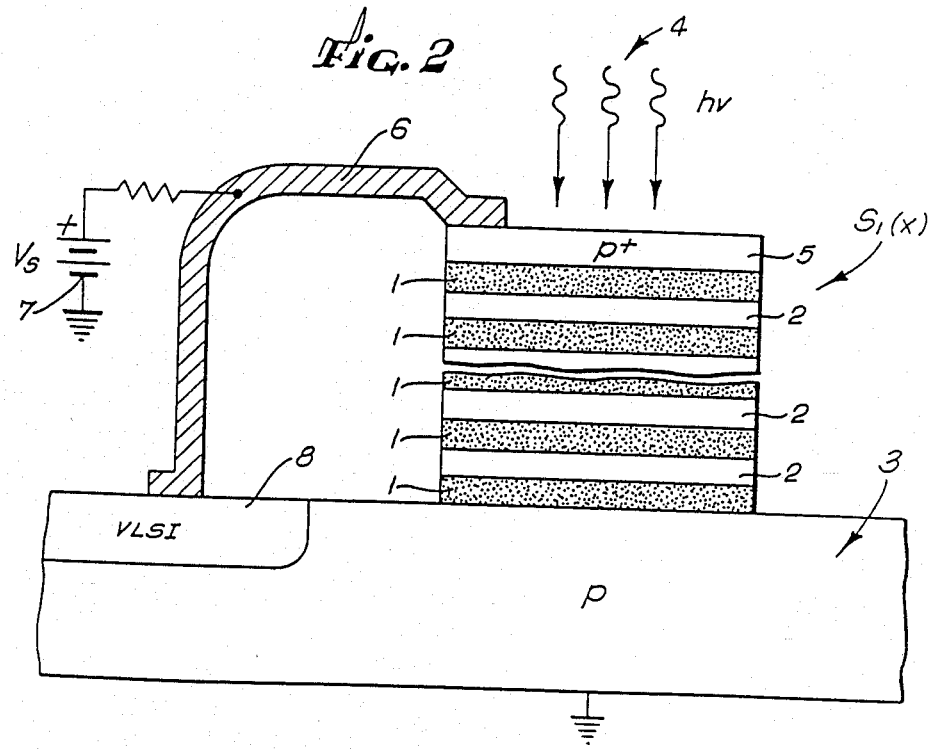
FIG. 2 is a cross-sectional view of a superlattice photodetector fabricated according to the present invention.

FIG. 2 is a cross-sectional view of a superlattice photodetector fabricated according to the present invention. Alternating superlattice layers 1 and 2 are grown on the surface of a substrate 3 to form a semiconductor superlattice structure $S_1(x)$. The alternating layers are very thin, preferably 100 angstroms or less, to permit strain layer stretching. The first superlattice layer 1 is composed of an alloy having the general form $(A_xB_{1-x})_y C_{1-y}$ where x is an alloy constituency number selected at the time of manufacture. Preferably, the first superlattice layer 1 is composed of heavily p-doped $Ge_xSi_{1-x}$. The second superlattice layer 2 is made of a different material, preferably intrinsic silicon (undoped). The substrate 3 is preferably composed of p-type silicon.

Incoming photon radiation 4 passes through a radiation window layer 5, preferably made of a 1 micron thick layer of heavily doped p-type silicon, to excite charge carriers that are trapped in energy wells formed at the junctions of the alternating superlattice layers 1 and 2. A metal terminal contact 6 couples the radiation window layer 5 to a voltage supply 7 and an "on chip" signal processing circuit 8. The "on chip" signal processing circuit 8 is preferably a VLSI circuit formed in the silicon substrate 3 and designed to process signals developed by the superlattice photodetector $S_1(x)$.

Figure 3:
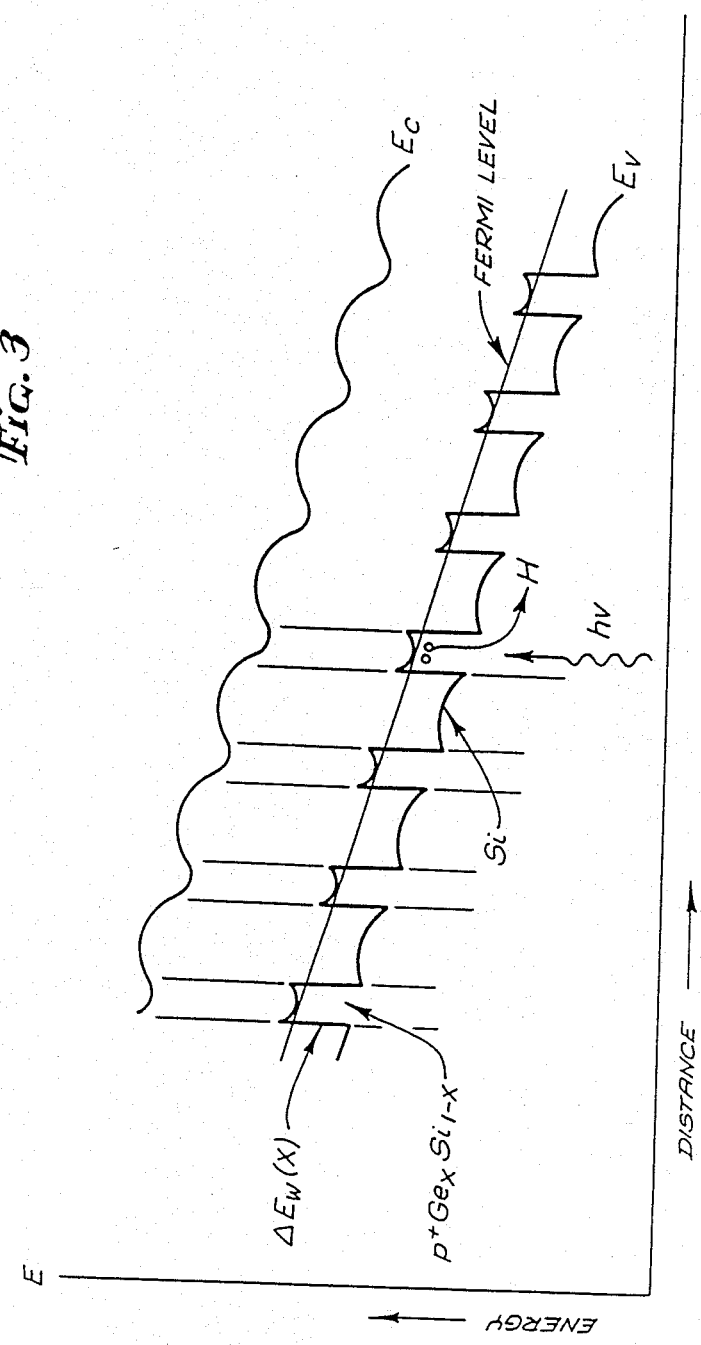
FIG. 3 is an energy diagram illustrating the photon detection mechanism of the device shown in FIG. 2.

Photon detection takes place in the preferred $Ge_xSi_{1-x}/Si$ superlattice structure $S_1(x)$ by photon excitation of trapped holes. Si and Ge have approximately equal conduction band energy levels but differ in their valence band energies by roughly 0.44 eV. The energy band incline shown in FIG. 3 results when a voltage, $V_s$, is applied across the superlattice structure in the vertical or stacking direction. Energy wells form along the valence energy curve $E_v$ of the superlattice structure as shown in FIG. 3. Conduction band differences along the conduction energy curve $E_c$ are negligible. Holes trapped in the valence band energy wells of the $Ge_xSi_{1-x}$ layers are excited downwardly into the hole conduction band (valence band of the Si layers) when they absorb photon radiation, $E_{photon}=h\nu$, of sufficient quantum energy. The valence band energy wells have a well height $E_W(x)$ that is a function of the alloy constituency number x selected at the time of device fabrication.

Figure 4:
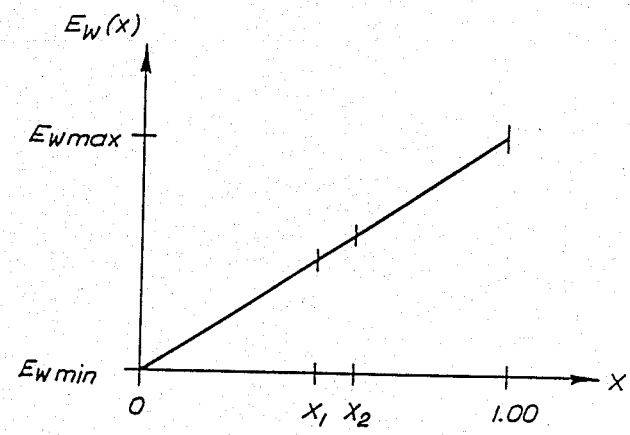
FIG. 4 is graph of the energy well height $E_W(x)$ versus an alloy constituency concentration number x according to the present invention.

Referring to FIG. 4, $E_W(x)$ is maximum when $x=1.00$ and minimum when x approaches 0. With x set to 1.00, the superlattice structure $S_1(x)$ becomes a simple Ge/Si superlattice with a valence band energy difference of roughly 0.44 eV. The valence band energy differential results from the energy gap difference between Si (1.11 eV) and Ge (0.67 eV). $E_W(x)$ drops to a minimum value $E_{Wmin}$ when x approaches zero. The well height $E_W(x)$ can be set to any arbitrary value between $E_{Wmin}$ and $E_{Wmax}$ simply by preselecting the alloy constituency value, x, at the time of fabrication. The critical photon wavelength at which detection begins can accordingly be set to any arbitrary wavelength falling in the range $hc/E_{Wmax}$ to $hc/E_{Wmin}$.

In an alternate embodiment, a ternary alloy such as $(Ge_xSi_{1-x})_y Sn_{1-y}$ where y is adjusted at the time of manufacture to a value preferably greater than 0.95 may be utilized to increase the energy range between $E_{Wmin}$ and $E_{Wmax}$. Materials other than tin, that exhibit good solubility in GeSi may also be used.

Figure 5:
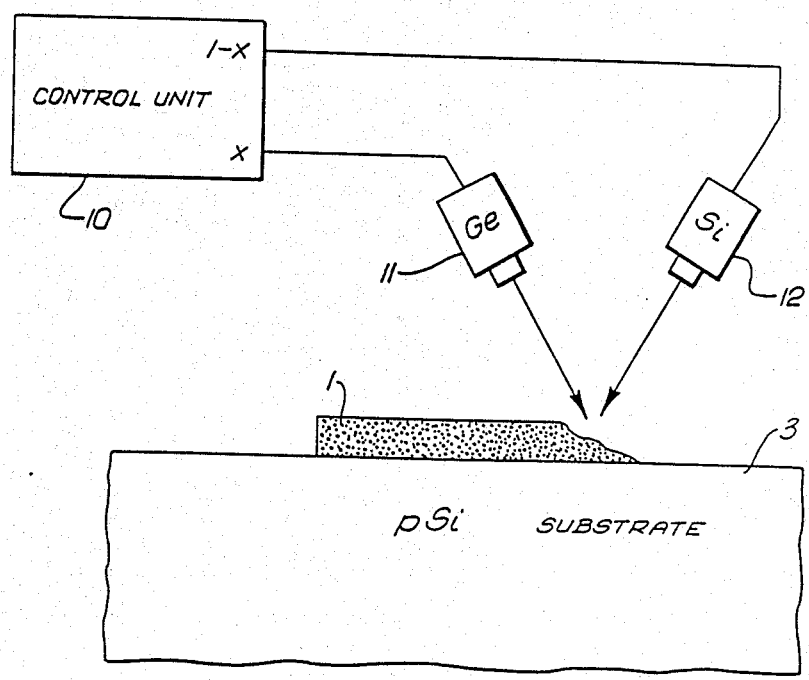
FIG. 5 schematically illustrates one method of deposition of an alloy layer of a superlattice structure according to the present invention.

An apparatus for selecting the alloy constituency number x at the time of fabrication is diagrammed in FIG. 5. A first superlattice layer 1 made of a variable constituency alloy, preferably $Ge_xSi_{1-x}$, is deposited on the substrate 3 (preferably made of conductive Si) by molecular beam epitaxy. A first alloy component source 11 supplies a beam of Ge atoms (and impurity atoms) to form the p-doped $Ge_xSi_{1-x}$ layer and a second alloy component source 12 supplies the Si atoms (and impurity atoms). The number of atoms supplied by each of the alloy component sources, 11 and 12 is controlled by a control unit 10. The control unit 10 is preferably adapted to respond to computer generated control signals that are supplied from the same computer which controls fabrication of the adjacent VLSI circuitry 8. Concurrent tailoring of the photodetector's wavelength sensitivity to match the design requirements of the associated VLSI circuitry becomes possible with such an arrangement.

While the alloy component sources 11 and 12 are shown as two separate structures in FIG. 5, this is done primarily for illustrating the underlying principle of the present invention. It is to be understood that other controllable means for selecting the alloy constituency number x are encompassed by the present invention; for example the $Ge_xSi_{1-x}$ first superlattice layer may be formed by a single beam source whose vapor source is a controlled mixture of doping agents (impurity atoms), Ge and Si, or by a single beam source operated on a time shared basis and selectively connected to a plurality of alloy component tanks.

The second superlattice layer 2 (preferably made of intrinsic Si) is deposited above the first layer 1 forming a heterojunction between the first layer and second layer. Repeating the process, thin layers of $Ge_xSi_{1-x}$ and Si are alternately deposited to form the superlattice structure shown in FIG. 2. The topmost layer 5, made of p+ doped Si is preferably formed as a thicker layer (approximately 1 micron or less) to protect the superlattice structure sandwiched between it and the substrate 3. It serves both as an electrical contact layer for a metalized contact 6 and as a radiation window for incoming infrared radiation 4.

Figure 6:
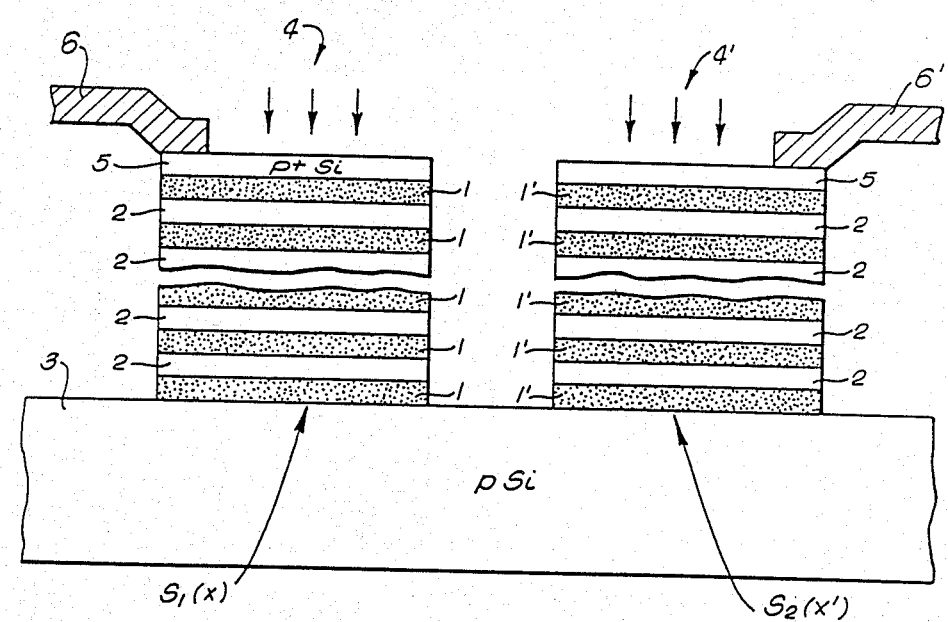
FIG. 6 is a cross-sectional view of side by side superlattice photodetectors formed on a single silicon subtrate according to the present invention.

The fabrication method illustrated in FIG. 5 can be easily applied to form multiple superlattice structures whose respective alloy constituency values, x, can be altered during deposition of each layer. FIG. 6 shows two superlattice structures $S_1(x)$ and $S_2(x')$ formed side by side in which the right-hand superlattice structure $S_2(x')$ has a first alloy layer 1' composed of $Ge_{x'}Si_{1-x'}$ where x' is different from the alloy constituency value x of the left-hand superlattice structure $S_1(x)$. Both x and x' are preestablished alloy constituency values determined by the control unit 10 at the time of manufacture.

A narrow band spectrometer can be constructed with the two superlattice alloy constituency values x, and x', set just slightly apart. Referring back to FIG. 4, assume that x is set equal to $x_1$ and x' is set equal to $X_2$. If photon detection occurs in the first superlattice structure $S_1(x_1)$ but not in the second superlattice structure $S_2(x_2)$, the frequency of the detected radiation can be determined to be be within the narrow frequency range limited by $E_W(x_1)$ and $E_W(x_2)$. Additional superlattice structures $S_3(x), \ldots, S_n(x_n)$ may be fabricated at the same time to provide discrimination at other wavelength bands.

Figure 7:
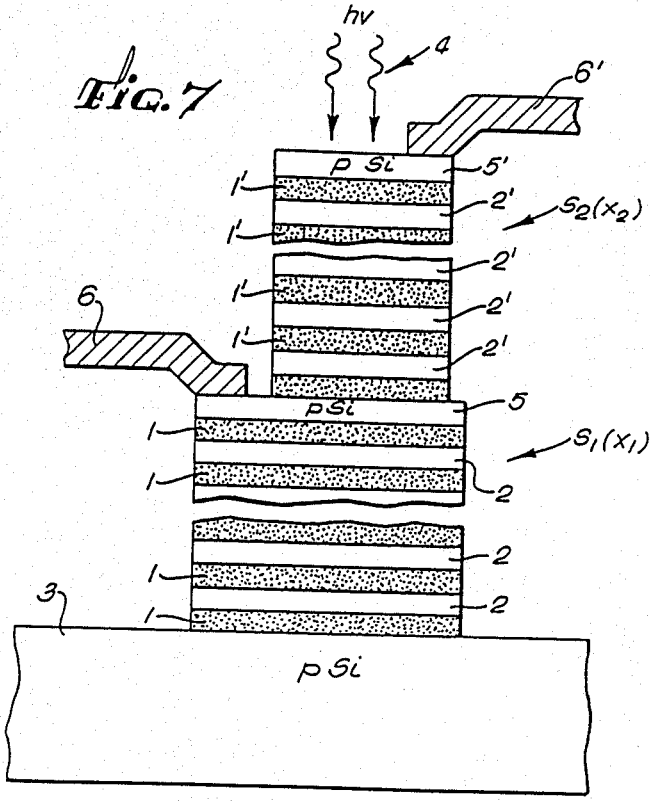
FIG. 7 is a cross-sectional view of a tandem junction superlattice structure according to the present invention.

A tandem junction spectrometer according to the present invention is illustrated in FIG. 7. Intermediate contact layer 5 is exposed by etching or other known techniques. The upper structure $S_2(X_2)$ is preferably much shorter than the lower structure so the $S_2(x_2)$ structure absorbs high energy photons and only some of the lower energy photons (by absorption mechanisms other than the valence band carrier excitation discussed), letting some lower energy photons pass through to the superlattice structure below. Current flow through the lower structure $S_1(x_1)$ indicates detection of photons in the energy range $E_W(x_1) < E_{photon} < E_W(x_2)$.

The minimal excitation energy level $E_W$ of a superlattice photodetector is established during manufacture according to the invention simply by using a fabrication technique which allows control of the alloy constituency value of a superlattice alloy layer and controlling the alloy constituency value, x, to be any preestablished value between 0 and 100 percent. Any arbitrary wavelength falling between the available energy gap extremes $E_{Wmin}$ and $E_{Wmax}$ can then be selected as the detection cut off wavelength for the photodetector. Discrimination among close wavelengths becomes possible. In the preferred $Ge_xSi_{1-x}$/Si superlattice embodiment, any arbitrary wavelength between 2.7 to 50 microns can be selectively detected. Lower energy detectors are operable at room temperature while higher energy detectors are preferably cooled to below room temperature to reduce background thermal noise.

High quality $Ge_xSi_{1-x}$/Si superlattices with x less than or equal to 0.50 grown by molecular beam epitaxy have been demonstrated. Fabrication of superlattices with values of x in the range of 0.50 to 1.00 is also achievable. The invention is not limited to molecular beam epitaxy, structures such as the one shown in FIG. 2 may be fabricated by other growth techniques such as chemical vapor deposition for example.

The mechanism at the heterojunction of the device shown in FIG. 2 is similar to the charge carrier conduction mechanism occurring in a Schottky-barrier diode, with the metal junction layer of the Schottky diode being replaced by the heavily doped $Ge_xSi_{1-x}$ layers of superlattice. Compared to a single junction diode, the superlattice structure shown in FIG. 2 has many charge separation barriers which results in drastically enhanced detection sensitivity. The superlattice device can be operated in an avalanche mode under which gain can be made very high and response time very short.

Current flow between the metal contact 6 and the conductive substrate layer 3 can be coupled to VLSI circuitry 8 formed on the same silicon substrate 3 to transmit signals directly to the adjacent VLSI circuitry. Data collected by the photodetector can then be quickly processed by the adjacent VLSI circuitry. The optical detection characteristics of the superlattice structure can be custom tailored according to the manner indicated in FIG. 4 to match the design requirements of the associated VLSI data processing circuitry at the same time the VLSI circuit is formed on the substrate 3. Reduced manufacturing cost and circuit size reduction can be realized by fabricating the superlattice photodetector structure with its associated VLSI processing circuitry on a common substrate.

I claim:

1. An infrared photodetector comprising;
   a silicon substrate;
   a $Ge_xSi_{1-x}$/Si first supperlattice formed on said silicon substrate, where $0 < x \leq 1.00$, $Ge_xSi_{1-x}$ layers of the first superlattice are doped with a p-type impurity, and Si layers of the first superlattice are intrinsic.

2. An infrared photodetector according to claim 1 wherein x is in the range 0 to 0.50.

3. An infrared photodetector according to claim 1 further comprising signal processing means formed on said silicon substrate for processing photodetection signals developed by said superlattice.

4. An infrared photodetector according to claim 1 wherein
  a portion of the silicon substrate, underlying the first superlattice, is doped to have a p-type conductivity characteristic.

5. An infrared photodetector according to claim 4 further comprising
  a radiation window layer disposed above the first superlattice so as to sandwich the first superlattice between the radiation window layer and the substrate, where the radiation window layer is thicker than at least one of the layers of the first superlattice and includes a p-type semiconductor.

6. An infrared photodetector according to claim 1 further comprising
  a $Ge_{x'}Si_{1-x'}$/Si second superlattice formed on the substrate, where $0 < x' \leq 1.00$, $x'$ is different from $x$, $Ge_{x'}Si_{1-x'}$ layers of the second superlattice are doped with a p-type impurity, and Si layers of the second superlattice are intrinsic.

7. An infrared photodetector according to claim 6 wherein
  the first superlattice is sandwiched between the substrate and the second superlattice.

8. An infrared photodetector according to claim 6 wherein
  the first and second superlattices are positioned side by side next to one another on the substrate.

9. An infrared photodetector according to claim 6 further comprising
  current flow detection means, coupled to the first and second superlattices for detecting current flow through the first and second superlattices.

10. An infrared photodetector according to claim 1 further comprising
  current flow detection means, coupled to the first and superlattice for detecting current flow through the first superlattice.

11. A photodetector circuit comprising:
  a semiconductor substrate;
  a superlattice, grown on said substrate, including a herterojunction layer composed of a p-doped semiconductive alloy of the general ternary form $(A_xB_{1-x})_yC_{1-y}$, where $A_xB_{1-x}$ is a binary semiconductive alloy, C is a band gap altering material for altering the band gap of the binary alloy $A_xB_{1-x}$, y is equal to or greater than 0.95, and C is substantially soluble in the binary allow $A_xB_{1-x}$ for $y \geq 0.95$.

12. A photodetector according to claim 11 wherein A is germanium, B is silicon and C is tin.

13. A photodetector comprising:
  a first superlattice having one or more $Ge_xSi_{1-x}$/Si heterojunctions wherein the $Ge_xSi_{1-x}$ side of each heterojunction is doped with a p-type impurity and the Si side is intrinsic.

14. A photodetector according to claim 13 further including
  A second superlattice having one or more $Ge_{x'}Si_{1-x'}$/Si heterojunctions wherein $x'$ is different from $x$.

15. A photodetector comprising:
  a superlattice having one or more $(Ge_xSi_{1-x})_ySn_{1-y}$/Si heterojunctions wherein $y \geq 0.95$, the $(Ge_xSi_{1-x})_ySn_{1-y}$ side of each heterojunction is doped with a p-type impurity, and the Si side is intrinsic.

* * * * *